US012595820B2

(12) United States Patent
Ying-Hsing et al.

(10) Patent No.: US 12,595,820 B2
(45) Date of Patent: Apr. 7, 2026

(54) FOLDING PORTABLE DISPLAY DEVICE

(71) Applicant: Google LLC, Mountain View, CA (US)

(72) Inventors: Lee Ying-Hsing, Taipei City (TW);
Minghan Chan, Taipei City (TW);
Peisen Yin, Taipei City (TW);
Yao-Ming Chan, Taipei City (TW); **Liu
Jen Hsiang**, Taipei City (TW)

(73) Assignee: Google LLC, Mountain View, CA (US)

( * ) Notice: Subject to any disclaimer, the term of this
patent is extended or adjusted under 35
U.S.C. 154(b) by 156 days.

(21) Appl. No.: 18/553,639

(22) PCT Filed: Sep. 7, 2021

(86) PCT No.: PCT/US2021/049232
§ 371 (c)(1),
(2) Date: Oct. 2, 2023

(87) PCT Pub. No.: WO2023/038614
PCT Pub. Date: Mar. 16, 2023

(65) Prior Publication Data
US 2024/0183383 A1 Jun. 6, 2024

(51) Int. Cl.
*H05K 5/02* (2006.01)
*F16C 11/04* (2006.01)
(52) U.S. Cl.
CPC ............ *F16C 11/04* (2013.01); *H05K 5/0226* (2013.01)
(58) Field of Classification Search
CPC .................................................... G06F 3/041
See application file for complete search history.

(56) References Cited

U.S. PATENT DOCUMENTS

| | | | |
|---|---|---|---|
| 9,115,750 | B2 | 8/2015 | Park |
| 9,250,733 | B2 | 2/2016 | Lee et al. |
| 9,348,450 | B1 | 5/2016 | Kim |

(Continued)

FOREIGN PATENT DOCUMENTS

| | | |
|---|---|---|
| CN | 209472651 U | 10/2019 |
| CN | 209947310 U | 1/2020 |

(Continued)

OTHER PUBLICATIONS

FOR (Year: 2019).*

(Continued)

*Primary Examiner* — Jerry Wu
(74) *Attorney, Agent, or Firm* — Shumaker & Sieffert, P.A.

(57) ABSTRACT

An example a folding device includes a hinge assembly defining a first axis and a second axis; a first assembly that includes a first shaft rotatably connected to the hinge assembly about the first axis; a second assembly that includes a second shaft rotatably connected to the hinge assembly about the second axis; a first gear mounted on the first shaft; a second gear mounted on the second shaft, wherein the first gear is configured to mesh with the second gear to synchronize movement of the first assembly and the second assembly; a first member on the first shaft; a second member on the second shaft, wherein the first member and the second member are collectively configured to increase an amount of force needed to rotate the first assembly and the second assembly; and a display spanning the first assembly and the second assembly.

7 Claims, 10 Drawing Sheets

(56)        References Cited

U.S. PATENT DOCUMENTS

| | | | |
|---|---|---|---|
| 9,845,625 | B2 | 12/2017 | Park |
| 9,848,502 | B1 | 12/2017 | Chu et al. |
| 10,028,395 | B2 | 7/2018 | Chen et al. |
| 10,188,004 | B2 | 1/2019 | Yeh et al. |
| 10,545,541 | B1 | 1/2020 | Dighde et al. |
| 10,551,880 | B1 | 2/2020 | Ai et al. |
| 10,571,977 | B2 | 2/2020 | Escamilla et al. |
| 10,645,205 | B2 | 5/2020 | Lee |
| 10,893,129 | B2 | 1/2021 | Harmon et al. |
| 11,073,863 | B2 | 7/2021 | Kim et al. |
| 11,223,710 | B2 | 1/2022 | Cheng |
| 11,268,565 | B2 | 3/2022 | Bae et al. |
| 11,385,686 | B2 | 7/2022 | Ai et al. |
| 11,624,400 | B2 | 4/2023 | Bae et al. |
| 2007/0101541 | A1 | 5/2007 | Yin et al. |
| 2015/0047152 | A1 | 2/2015 | Cheng |
| 2015/0233162 | A1* | 8/2015 | Lee ...................... H04M 1/022 |
| | | | 16/223 |
| 2018/0146560 | A1 | 5/2018 | Chen et al. |
| 2018/0160553 | A1 | 6/2018 | Yeh et al. |
| 2020/0103935 | A1 | 4/2020 | Hsu |
| 2020/0166974 | A1* | 5/2020 | Ai ...................... H04M 1/0216 |
| 2020/0371553 | A1 | 11/2020 | Hsu et al. |
| 2021/0067614 | A1 | 3/2021 | Cheng |
| 2021/0108677 | A1 | 4/2021 | Bae et al. |
| 2021/0127506 | A1 | 4/2021 | Sim et al. |
| 2021/0181808 | A1 | 6/2021 | Liao et al. |
| 2022/0154765 | A1 | 5/2022 | Bae et al. |
| 2022/0342458 | A1 | 10/2022 | Ai et al. |
| 2023/0243387 | A1 | 8/2023 | Bae et al. |
| 2023/0320003 | A1 | 10/2023 | Menea et al. |
| 2024/0183383 | A1 | 6/2024 | Ying-hsing et al. |

FOREIGN PATENT DOCUMENTS

| | | | | |
|---|---|---|---|---|
| CN | 210240298 | U | * | 4/2020 |
| CN | 111698349 | A | | 9/2020 |
| CN | 212003929 | U | | 11/2020 |
| CN | 112817377 | A | | 5/2021 |
| CN | 213458799 | U | | 6/2021 |
| CN | 109712537 | A | | 6/2024 |
| EP | 2669759 | A1 | | 12/2013 |
| JP | 2010106991 | A | | 5/2010 |
| JP | 2021018419 | A | | 2/2021 |
| KR | 101170480 | B1 | | 8/2012 |
| KR | 20130134648 | A | | 12/2013 |
| KR | 20150096827 | A | | 8/2018 |
| KR | 101988966 | B1 | | 9/2019 |
| WO | 2018051414 | A | | 3/2018 |

OTHER PUBLICATIONS

Office Action from U.S. Appl. No. 17/996,504 dated Aug. 1, 2024, 16 pp.

Notice of Grant, and translation thereof, from counterpart Japanese Application No. 2024-514556 dated Mar. 11, 2025, 11 pp.

Response to Office Action, and translation thereof, dated Dec. 3, 2024, from counterpart Japanese Application No. 2024-514556 filed Feb. 27, 2025, 10 pp.

Response to Office Action dated Aug. 1, 2024 from U.S. Appl. No. 17/996,504, filed Oct. 8, 2024, 8 pp.

Office Action, and translation thereof, from counterpart Korean Application No. 10-2024-7001772 dated Jun. 5, 2025, 92 pp.

First Examination Report from counterpart Indian Application No. 202447003559 dated Jun. 19, 2025, 6 pp.

Response to Communication Pursuant to Rules 161(1) and 162 EPC dated Jan. 10, 2024, from counterpart European Application No. 21787112.8, filed May 31, 2024, 14 pp.

Notice of Allowance from U.S. Appl. No. 17/996,504 dated Dec. 9, 2024, 7 pp.

Office Action from counterpart Japanese Application No. 2024-514556 dated Dec. 3, 2024, 7 pp.

Corrected Notice of Allowance from U.S. Appl. No. 17/996,504 dated Dec. 18, 2024, 2 pp.

International Search Report and Written Opinion of International Application No. PCT/US2021/049232, dated May 20, 2022, 12 pp.

International Search Report and Written Opinion of International Application No. PCT/US2021/049237 dated May 18, 2022, 11 pp.

Communication pursuant to Article 94(3) EPC from counterpart European Application No. 21787112.8 dated Oct. 29, 2025, 7 pp.

Response to Office Action dated Jun. 19, 2025, from counterpart Indian Application No. 202447003559 filed Sep. 8, 2025, 10 pp.

Notice of Intent to Grant and Text Intended to Grant from European Application No. 21786302.6 dated Nov. 17, 2025, 66 pp.

\* cited by examiner

Fully closed

Fully open

FOLDING PORTABLE DISPLAY DEVICE

BACKGROUND

Devices that include displays may be referred to as display devices. In general, it may be desirable to increase a size of a display (e.g., the area on which images are displayed) as much as possible. Increasing the size of a display may make the device that includes the display large and unwieldy. For instance, devices with larger displays may not fit in pockets, bags, and the like. One way to increase the size of a display without unduly increasing the size of the device is to make the device collapsible such that the display can be folded (e.g., in half). However, folding displays may exhibit creases where the display bends.

SUMMARY

In general, aspects of this disclosure are directed to folding devices that include foldable continuous displays with supported a span. A folding device may include at least two assemblies (e.g., panels) and a mechanism configured to allow the assemblies to be moved into a collapsed state in which the device is considered closed and an expanded state in which the device is considered open. When the device is in the expanded state, a display may be visible and may cover at least a portion of an inner surface of all of the assemblies. As such, the device may be considered to be a continuous display (i.e., because it continues across a boundary between the assemblies). By utilizing such a folding device, the device may include a display with a relatively large length and/or width (e.g., display area) without overly increasing a length and/or width of the device when in the collapsed state. In this way, the "pocketability" of large-screen portable devices may be improved.

The device may include various components that synchronize movement of the assemblies. For instance, the device may include a plurality of gears that synchronize movement of the assemblies. To synchronize movement, the components may cause the two assemblies to remain in a mirrored position with respect to a hinge assembly to which the two assemblies are attached. In some examples, it may be desirable to increase an amount of force needed to rotate the assemblies.

In accordance with one or more aspects of this disclosure, a folding device may include force members configured to increase an amount of force needed to rotate the assemblies. For instance, the folding device may include disk springs mounted on shafts about-which the assemblies rotate, the disk springs configured to increase the amount of force needed to rotate the assemblies. In this way, the force members may provide the folding device with a more rigid feel. Also in this way, the force members may enable the folding device to hold intermediate positions between fully open and fully closed (e.g., a half open position where the assemblies are at approximately a 90 degree angle with respect to each other).

In one example, a folding device includes a hinge assembly defining a first axis and a second axis; a first assembly comprising a first hinge arm that includes a first shaft rotatably connected to the hinge assembly about the first axis; a second assembly comprising a second hinge arm that includes a second shaft rotatably connected to the hinge assembly about the second axis; a first gear mounted on the first shaft; a second gear mounted on the second shaft, wherein the first gear is configured to mesh with the second gear to synchronize movement of the first assembly and the second assembly; a first force member mounted on the first shaft; a second force member mounted on the second shaft, wherein the first force member and the second force member are collectively configured to increase an amount of force needed to rotate the first assembly and the second assembly; and a continuous display spanning an inner surface of the first assembly and an inner surface of the second assembly.

The details of one or more examples are set forth in the accompanying drawings and the description below. Other features, objects, and advantages of the disclosure will be apparent from the description and drawings, and from the claims.

DETAILED DESCRIPTION

Figure 1A:
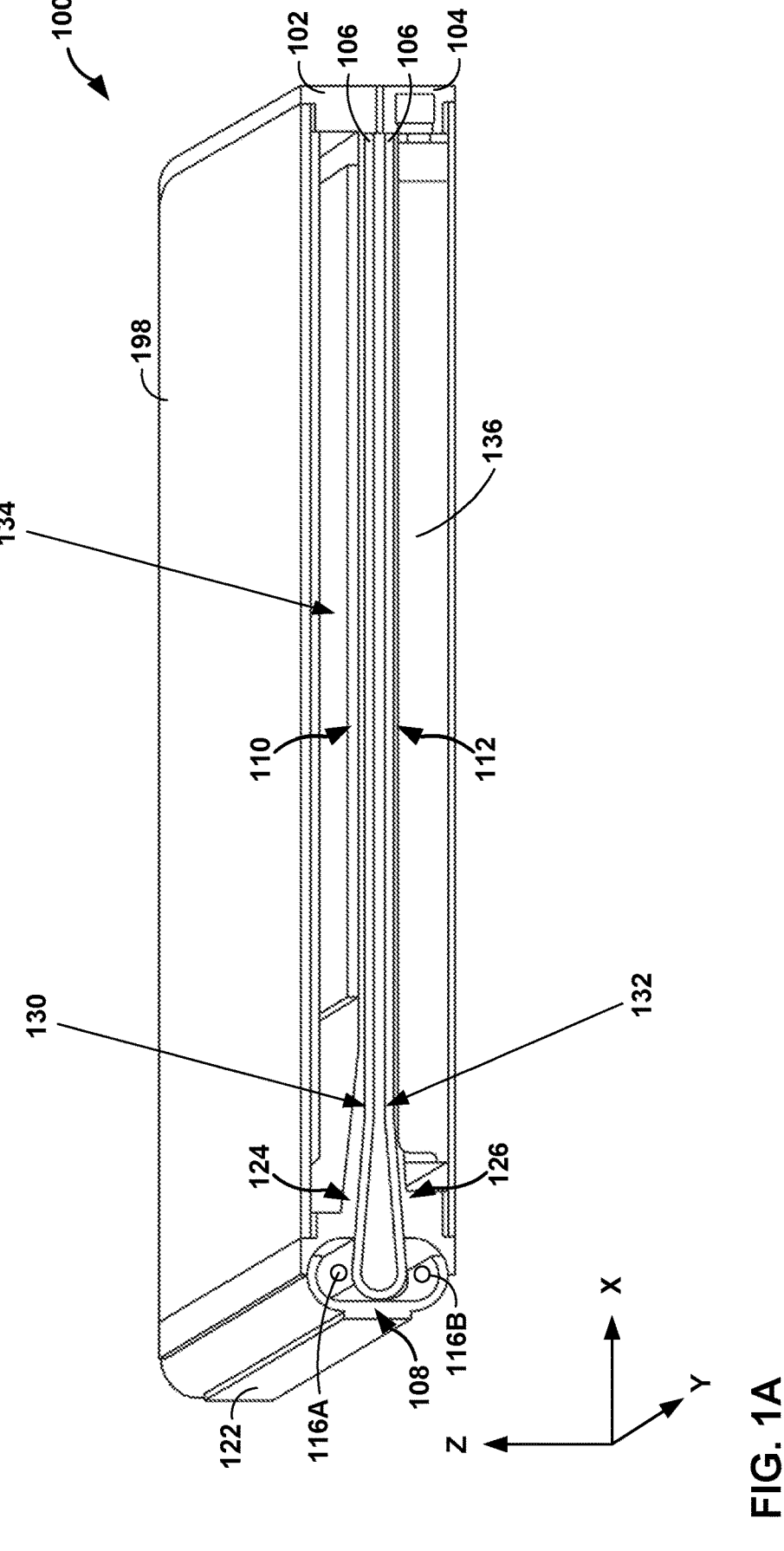
FIGS. 1A and 1B are schematic diagrams illustrating cross sections of a folding device with a multi-rigid segment flexible display, in accordance with one or more aspects of this disclosure.

FIG. 1A is a schematic diagram illustrating a cross section of a folding device with a multi-rigid segment flexible display, in accordance with one or more aspects of this disclosure. Examples of device 100 include foldable mobile computing devices such as foldable smart phones, foldable tablets, foldable e-readers, foldable gaming systems, or any other foldable portable device that includes a display.

As shown in FIG. 1A, device 100 includes first assembly 102, second assembly 104, continuous display 106, and hinge assembly 122. First assembly 102 may be configured to rotate about first axis 116A, which defines a first axis in the y-direction, and second assembly 104 may be configured to rotate about second axis 116B, which defines a second axis in the y-direction. Each of first assembly 102 and second assembly 104 may include an inner surface and an outer surface. The outer surface of first assembly 102 may be visible when looking down at device 100 in the z-axis and the outer surface of second assembly 104 may be visible when looking up at device 100 in the z-axis. The inner surfaces of first assembly 102 and second assembly 104 may not be externally visible when device 100 is closed.

As shown in FIG. 1A, first assembly 102 may include main logic board 134 and second assembly 104 may include battery 136. This is merely one example arrangement of components amongst first assembly 102/second assembly 104 and other arrangements are possible. For instance, both first assembly 102 and second assembly 104 may include respective batteries.

Continuous display 106 may be capable of rendering data into images viewable by a user of device 100. For example, continuous display 106 may include a matrix of pixels that are individually controllable. Examples of continuous display 106 include, but are not limited to, liquid crystal displays (LCD), light emitting diode (LED) displays, organic light-emitting diode (OLED) displays, micro light-emitting diode (microLED) displays, or similar monochrome or color displays capable of outputting visible information to a user of device 100.

In some examples, device 100 may include one or more displays in addition to continuous display 106. For instance, as shown in FIG. 1A, device 100 may include a first additional display on the outer surface of first assembly 302 (e.g., display 198). In some examples, device 100 may further include a second additional display on the outer surface of second assembly 104.

One or more of continuous display 106, the first additional display, and/or the second additional display may be presence-sensitive displays. In some examples, a presence sensitive display may detect an object at and/or near a screen. As one example range, a presence-sensitive display may detect an object, such as a finger or stylus that is within 2 inches or less of the screen. The presence-sensitive display may determine a location (e.g., an (x,y) coordinate) of a screen at which the object was detected. In another example range, a presence-sensitive display may detect an object six inches or less from the screen and other ranges are also possible. The presence-sensitive display may determine the location of the screen selected by a user's finger using capacitive, inductive, and/or optical recognition techniques. In some examples, presence sensitive display also provides output to a user using tactile, audio, or video stimuli.

Continuous display 106 includes first rigid segment 110 attached to first assembly 102 (e.g., positioned on the inner surface of first assembly 102 and coplanar with the inner surface of first assembly 102), flexible segment 108, and second rigid segment 112 attached to second assembly 104 (e.g., positioned on the inner surface of second assembly 104 and coplanar with the inner surface of first assembly 102). As can be seen in the example of FIG. 1, flexible segment 108 further includes rigid segment 124 connecting rigid segment 110 to flexible segment 108 and rigid segment 126 connecting rigid segment 112 to flexible segment 108. When device 100 is fully open, rigid segment 124 may be coplanar with the inner surface of first assembly 102 and rigid segment 126 may be coplanar with the inner surface of second assembly 104. However, when device 100 is fully closed, rigid segment 124 may not be coplanar with the inner surface of first assembly 102 and rigid segment 126 may not be coplanar with the inner surface of second assembly 104. Rigid segment 124 may be articulable relative to rigid segment 110 at hinge point 130. Rigid segment 126 may be articulable relative to rigid segment 112 at hinge point 132.

Rigid segments 110 and 112 may be referred to as primary rigid segments while rigid segments 124 and 126 may be referred to as secondary rigid segments. In some examples, a width (e.g., in the x-direction) of the primary rigid segments may be substantially larger than a width of the secondary rigid segments. For instance, a width of rigid segment 124 may be less than or equal to a quarter (25%) of a width of rigid segment 110. Similarly, a width of rigid segment 126 may be less than or equal to a quarter (25%) of a width of rigid segment 112.

The secondary rigid segments may be articulable relative to neighboring primary rigid segments. As one example, rigid segment 124 may be articulable relative to rigid segment 110 at hinge point 130. As another example, rigid segment 126 may be articulable relative to rigid segment 112 at hinge point 132. In some examples, the articulation points between secondary rigid segments and primary rigid segments (e.g., hinge points 130 and 132) may have large radii and limited movement as compared to the radius and movement of primary flexible segment 108. As one example, rigid segment 124 may be configured to articulate at most 45 degrees relative to rigid segment 110. As another example, rigid segment 126 may be configured to articulate at most 45 degrees relative to rigid segment 112.

Primary flexible segment 108 may connect the rigid segments of one side of device 100 to the rigid segments of the other side of device 100. For instance, as shown in FIG. 1, primary flexible segment 108 may connect rigid segment 124 to rigid segment 126. Primary flexible segment 108 may be configured to fold at least 180 degrees (e.g., to facilitate closure of device 100).

Device 100 may include one or more supporting plates (e.g., backer plates) configured to render segments of continuous display 106 flexible or rigid. The supporting plates may be positioned between emissive elements of continuous display 106 (e.g., OLEDs) and the inner surfaces of first assembly 102 and second assembly 104.

In some examples, device 100 may include respective supporting plates for segments of continuous display 106. For instance, the one or more supporting plates may include a first supporting plate attached to first rigid segment 110, a second supporting plate attached to second rigid segment 112, a third supporting plate attached to rigid segment 124, and/or a fourth supporting plate attached to rigid segment 126.

In some examples, the one or more supporting plates may include a respective supporting plate for each of first assembly 102 and second assembly 104 that support segments of continuous display 106 on the respective assembly. For instance, the one or more supporting plates may include a first supporting plate attached to first rigid segment 110 and rigid segment 124 that is configured to permit bending between first rigid segment 110 and rigid segment 124, and a second supporting plate attached to second rigid segment 112 and rigid segment 126 that is configured to permit bending between second rigid segment 112 and rigid segment 126.

In some examples, the one or more supporting plates may include a single supporting plate that is attached to segments of continuous display 106 on both first assembly 102 and second assembly 104. For instance, the one or more supporting plates may include a single supporting plate attached to primary flexible segment 108 and all primary and secondary rigid segments (e.g., first rigid segment 110, second rigid segment 112, rigid segment 124 and rigid segment 126). The single supporting plate may be configured to permit bending between the segments. To permit bending between segments, a supporting plate may be etched and/or perforated at a boundary between adjacent segments.

Figure 1B:
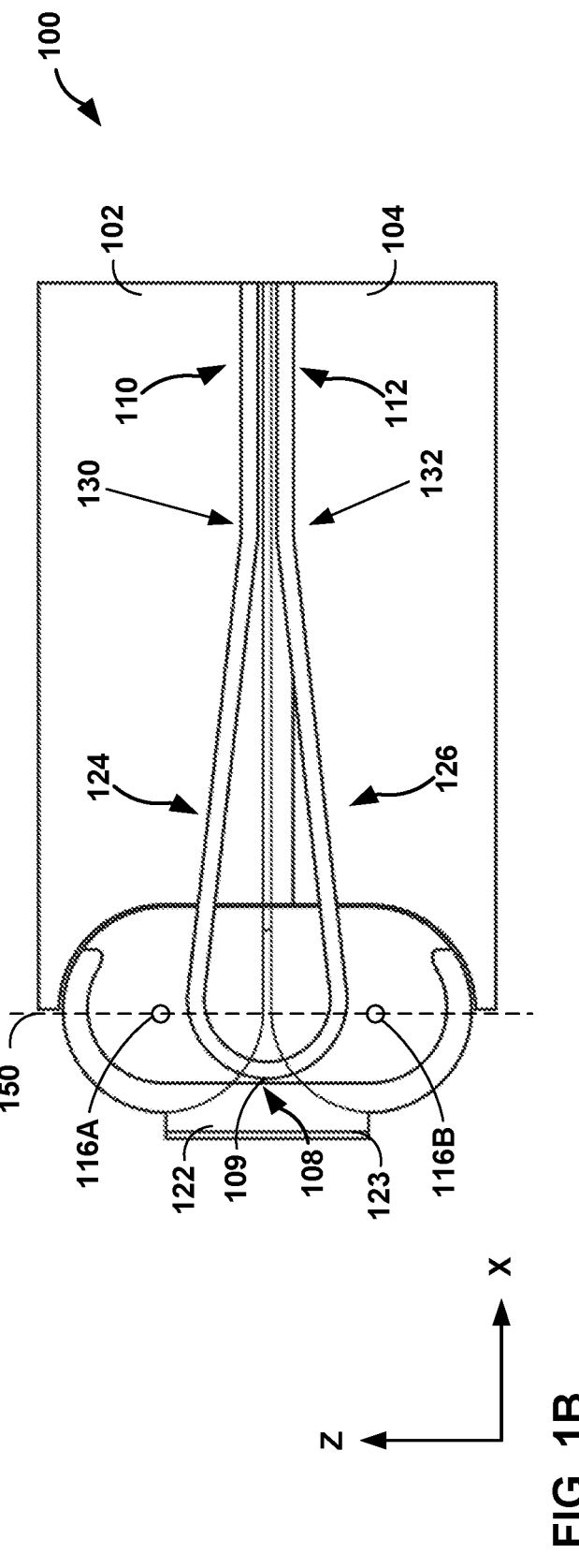

FIG. 1B is a schematic diagram illustrating a cross section of a folding device with a multi-rigid segment flexible display that includes multiple secondary rigid segments, in accordance with one or more aspects of this disclosure. As shown in FIG. 1i, display 106 may include primary rigid segments 110 and 112, primary flexible segment 108, and secondary rigid segments 124 and 126.

In some examples, hinge assembly 122 may include a cavity into which at least a portion of display 106 may recede when device 100 is fully closed. For instance, as discussed in further detail below, a center region of hinge assembly 122 may be "hollowed out" to receive at least a portion of primary flexible segment 108. As shown in FIG. 1B, when the folding device 100 is fully closed, an apex of the primary flexible segment (e.g., apex 109 of primary flexible segment 108) is closer to the outer surface of the hinge assembly (e.g., outer surface 123 of hinge assembly 122) than a plane that is parallel to the first axis and a second axis (e.g., plane 150 that is parallel to first axis 116A and second axis 116B). By allowing at least a portion of display 106 may recede when device 100 is fully closed, device 100 may avoid the need for a rotate and slide mechanism. In this way, the design of a foldable display device may be simplified.

Figure 2:
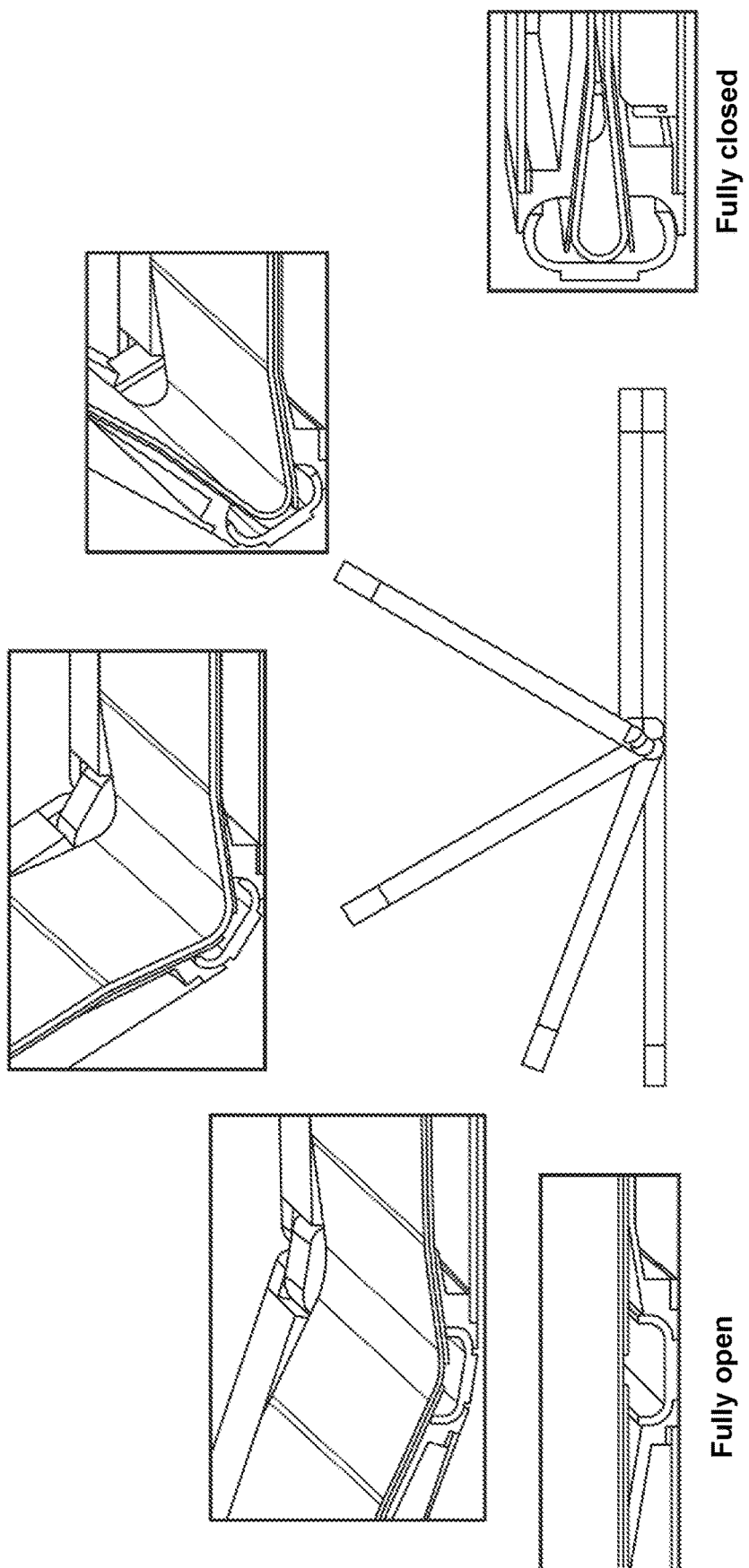
FIG. 2 is a schematic diagram illustrating a folding device with a flexible display in a plurality of folded states, in accordance with one or more aspects of this disclosure.

FIG. 2 is a schematic diagram illustrating a folding device with a flexible display in a plurality of folded states, in accordance with one or more aspects of this disclosure. As can be seen in FIG. 2, at least a portion of a primary flexible segment of a display resides within a hinge assembly while the folding device is closed. As also shown in FIG. 2, when the folding device is fully open, an inner surface of a first assembly is coplanar with an inner surface of a second assembly.

Figure 3:
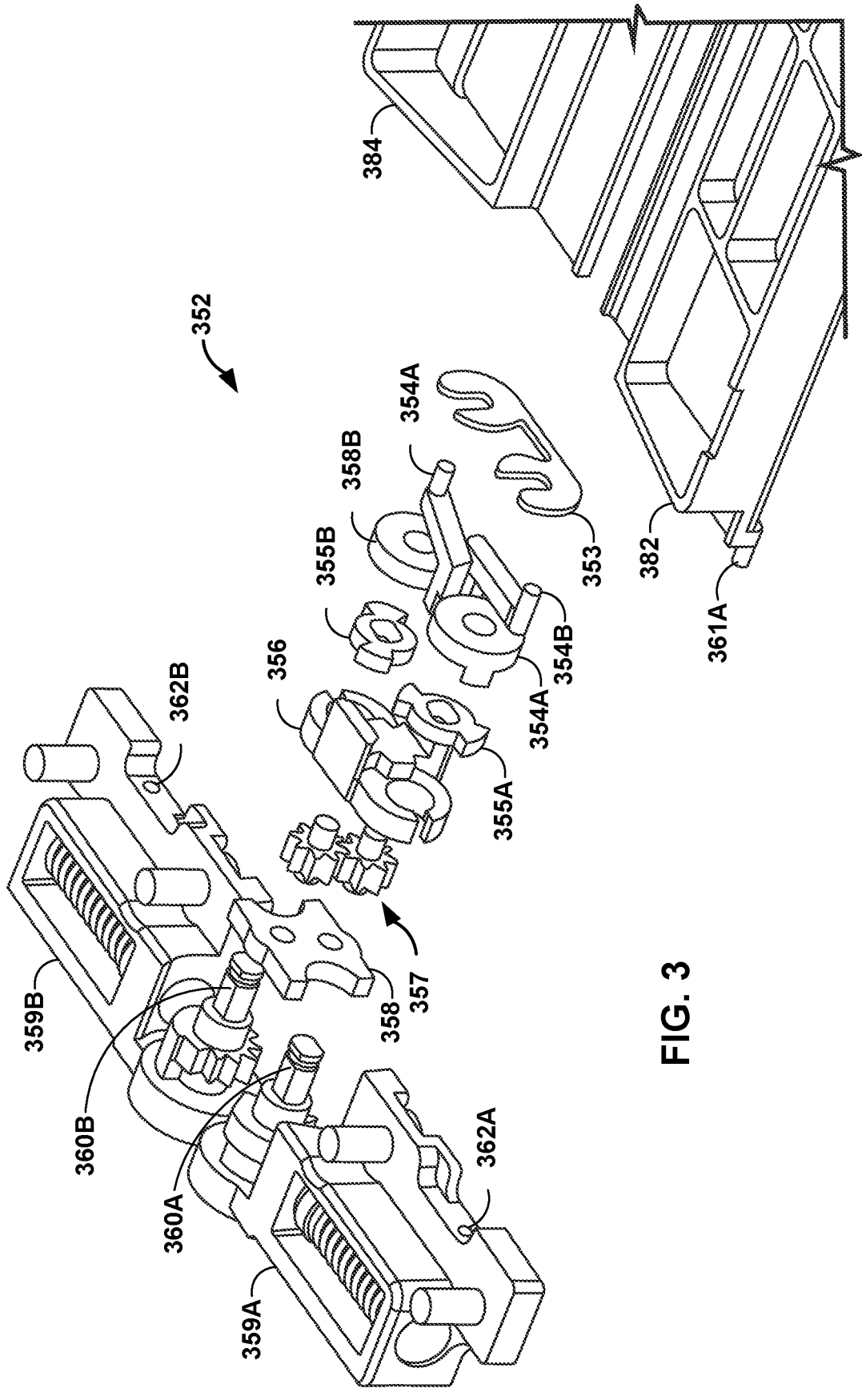
FIG. 3 is a schematic diagram illustrating an exploded view of components of a folding device with a flexible display having support platforms, in accordance with one or more aspects of this disclosure.

FIG. 3 is a schematic diagram illustrating an exploded view of components of a folding device with a flexible display having support platforms, in accordance with one or more aspects of this disclosure. As discussed above, a folding device may include one or more collapsible support platforms that support a display of the folding device 300. For instance, as shown in FIG. 3, folding device 300 may include collapsible support platforms 382 and 384

For instance, collapsible support platform 382 may be included in first assembly 302 and may support a portion of a continuous display (e.g., secondary rigid segment 124 and/or at least a portion of primary flexible segment 108) when device 300 is fully opened. Similarly, collapsible support platform 384 may be included in second assembly 304 and may support a portion of the continuous display (e.g., secondary rigid segment 126 and/or at least a portion of primary flexible segment 108) when device 300 is fully opened.

A folding device, such as device 300, may include components 352 that are configured to actuate collapsible support platforms 382/384. For instance, as device 300 is moved to from the fully closed state to the fully opened state, components 352 may cause collapsible support platforms 382/384 to deploy. Similarly, as device 300 is moved to from the fully opened state to the fully closed state, components 352 may cause collapsible support platforms 382/384 to retract. In this way, when device 300 is closed, components 352 enable collapsible support platforms 382/384 to move out of the way such that a portion of display 306 may reside within a hinge assembly, such as hinge assembly 122.

As shown in the example of FIG. 3, components 352 may include shaft clip 353, lever arms 354A and 354B (collectively, "lever arms 354"), lever knobs 355A and 355B (collectively, "lever knobs 355"), clamp stop 356, synchronization components 357, cap bracket 358, and hinge arm assemblies 359A and 359B (collectively, "hinge arm assemblies 359). As shown in FIG. 3, hinge arm assemblies 359 may each include a pin on which other components may be mounted. For instance, hinge arm assembly 359A may include pin 360A on which at least lever knob 355A and lever arm 354A may be mounted, and hinge arm assembly 359B may include pin 360B on which at least lever knob 355B and lever arm 354B may be mounted. Pin 360A may be centered about a first axis, such as first axis 116A. Pin 360B may be centered about a second axis, such as second axis 116B.

As device 300 is moved between opened and closed positions, lever knobs 355 may remain fixed on their respective axes. For instance, as shown in FIG. 3, an outer geometry of pin 360A and an inner geometry of lever knob 355A may prevent lever knob 355A from rotating about pin 360A. Similarly, an outer geometry of pin 360B and an inner geometry of lever knob 355B may prevent lever knob 355B from rotating about pin 360B. As pins 360 are respectively attached to the first assembly and the second assembly (e.g., via hinge arm assemblies 359), such an arrangement may result in lever knobs 355 respectively rotating in sync with the first assembly and the second assembly.

At a certain point in the transition from closed to open (e.g., 155 degrees), appendages of lever knobs 355 may cause lever arms 354 to rotate. Rotation of lever arms 354 may cause deployment of collapsible support platforms 382/384. For instance, rotation of lever arm 354A may push collapsible support platform 384 up towards a rear surface of a display (e.g., display 106). Similarly, rotation of lever arm 354B may push collapsible support platform 382 up towards the rear surface of the display.

As shown in FIG. 3, each of collapsible support platforms 382/384 may each include a pin that is configured to mate with a hole in a hinge arm assembly of hinge arm assemblies 359. For instance, collapsible support platform 382 may include pin 361A configured to mate with hole 362A of hinge arm assembly 359A. Similarly, collapsible support platform 384 may include pin 361B configured to mate with hole 362B of hinge arm assembly 359B. While only one end of collapsible support platforms 382/384 is shown in FIG. 3, it is understood that the other ends of collapsible support platforms 382/384 may include pins similar to pins 361A/361B.

When pushed by lever arms 354, collapsible support platforms 382/384 may be configured to rotate about pins 361A/361B. For instance, to push collapsible support platform 382 toward the rear surface of the display, lever arm 354B may cause collapsible support platform 382A to rotate about pin 361A. Similarly, to push collapsible support platform 384 toward the rear surface of the display, lever arm 354A may cause collapsible support platform 384 to rotate about pin 361B.

Figures 4A, 4B:
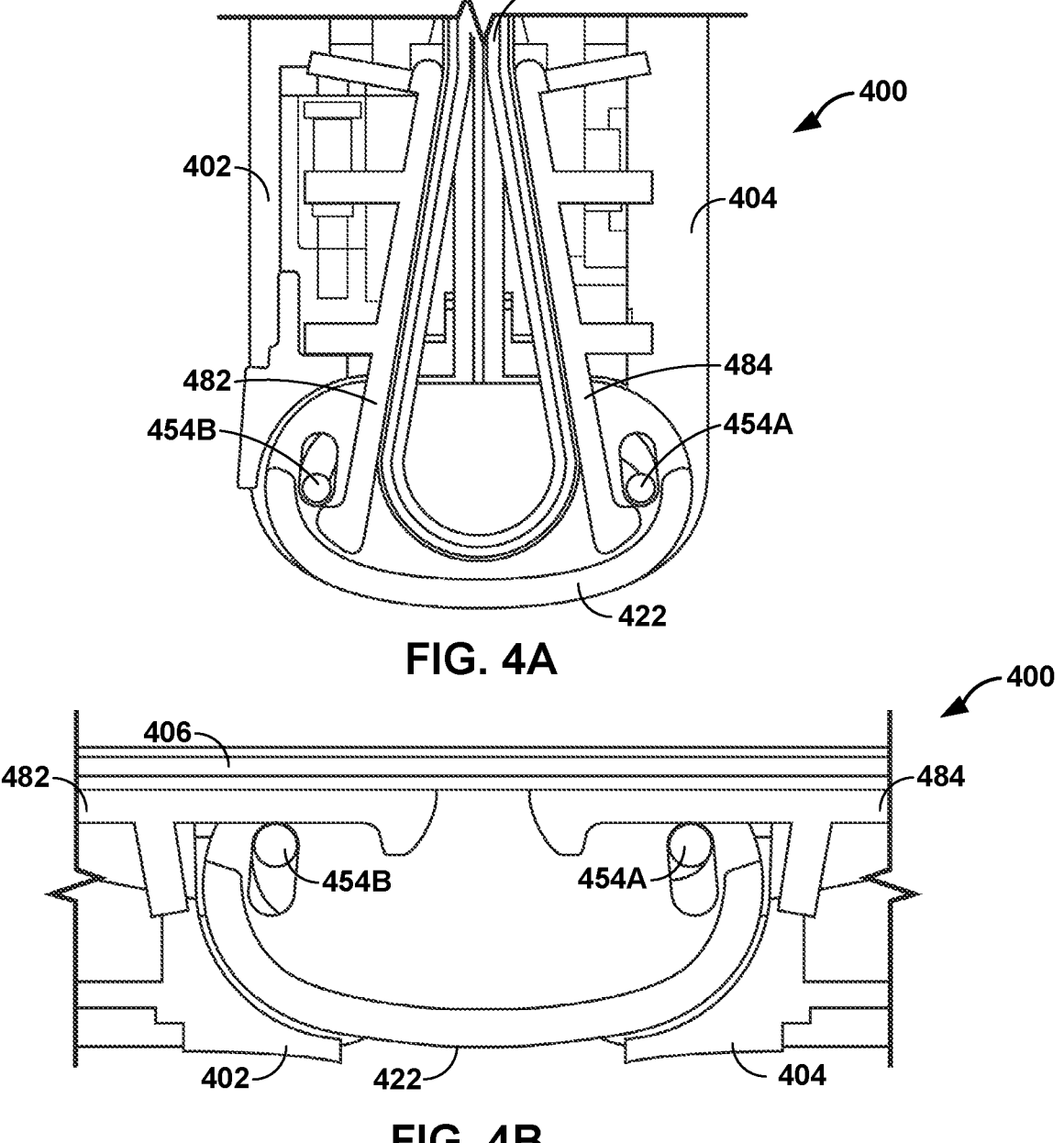
FIGS. 4A and 4B are schematic diagrams illustrating cross sections of a folding device with a flexible display having support platforms in a variety of positions, in accordance with one or more aspects of this disclosure.

FIGS. 4A and 4B are schematic diagrams illustrating cross sections of a folding device with a flexible display having support platforms in a variety of positions, in accordance with one or more aspects of this disclosure. As shown in FIGS. 4A and 4B, folding device 400 may include first assembly 402, second assembly 404, continuous display 406, and hinge assembly 422. Folding device 400, first assembly 402, second assembly 404, continuous display 406, and hinge assembly 422 of FIGS. 4A and 4B may be examples of folding device 100, first assembly 102, second assembly 104, continuous display 106, and hinge assembly 122 of FIGS. 1A and 1B. Folding device 400 may also include lever arms 454A and 454B (collectively, "lever arms 454") and collapsible support platforms 482/484. Lever arms 454 and collapsible support platforms 482/484 of FIG. 4 may be examples of lever arms 354 and collapsible support platforms 382/384 of FIG. 3.

As discussed above, a folding device may include lever arms that move to deploy collapsible support platforms. For instance, as shown in FIGS. 4A and 4B, lever arms 454 may deploy collapsible support platforms 482 and 484. Such an arrangement may introduce one or more disadvantages. For example, lever arms 454 may experience various failures, such as bending or breaking. Failures of lever arms 454 may result in incomplete deployment of collapsible support platforms 482 and 484, which may be undesirable.

Figure 5A:
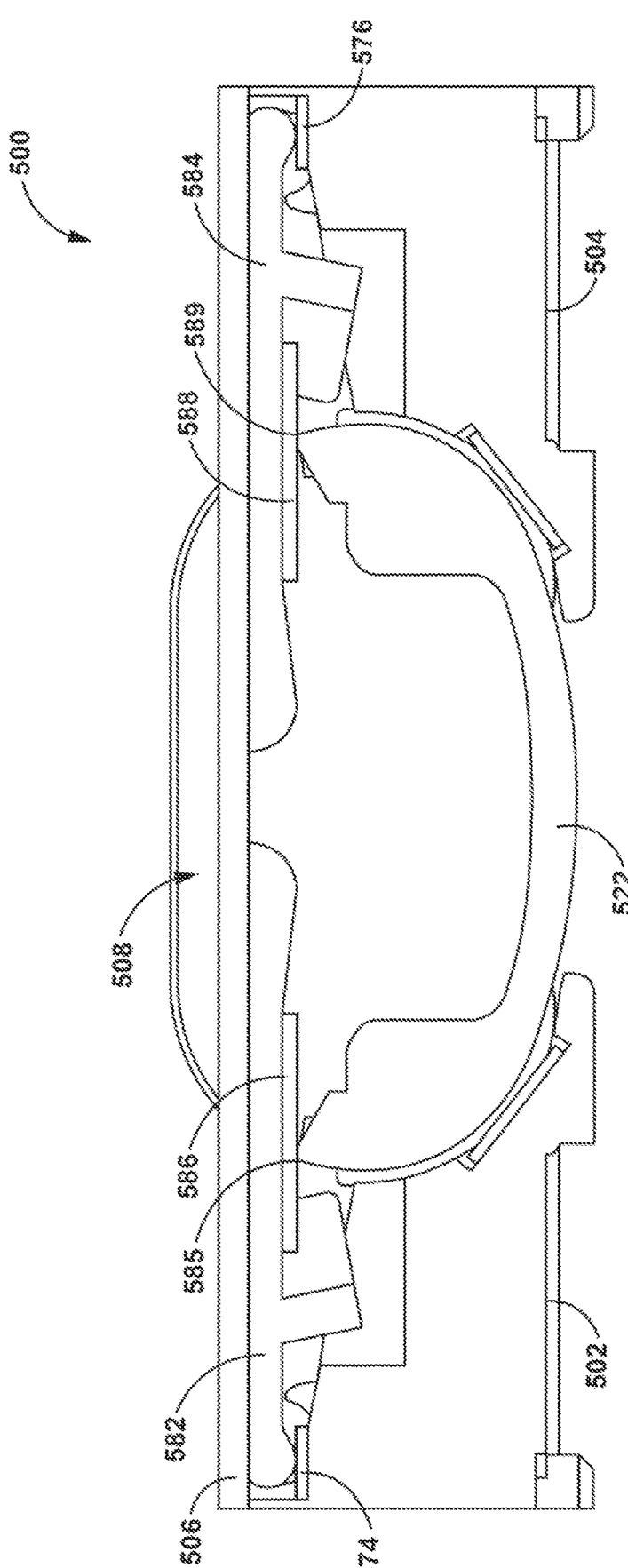
FIGS. 5A and 5B are schematic diagrams illustrating cross sections of a folding device with a flexible display having support platforms in a variety of positions, in accordance with one or more aspects of this disclosure.
Figure 5B:
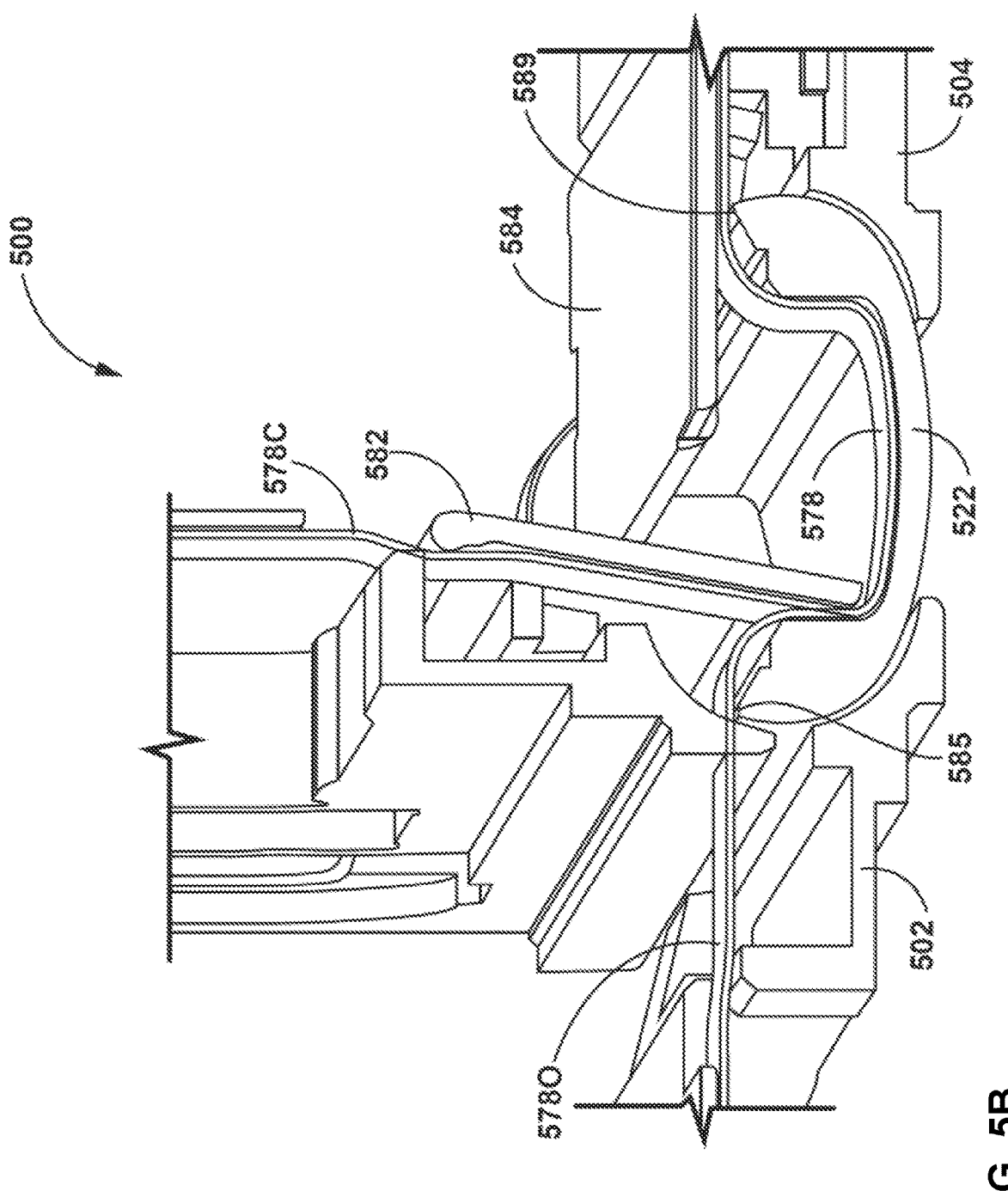

FIGS. 5A and 5B are schematic diagrams illustrating cross sections of a folding device with a flexible display having support platforms in a variety of positions, in accordance with one or more aspects of this disclosure. Folding device 500 may be an example of device 100 as discussed above. FIG. 5A illustrates folding device 500 in the fully open position. For purposes of explanation, FIG. 5B illustrates folding device in a one side open/one side closed position, though such a position may not actually be possible (e.g., the first assembly and the second assembly may be synchronized to maintain the same relative orientations with respect to the hinge assembly). As shown in FIGS. 5A and 5B, folding device 500 includes first assembly 502, second assembly 504, hinge assembly 522, continuous display 506, first collapsible support platform 582, and second collapsible support platform 584. First assembly 502, second assembly 504, hinge assembly 522, and continuous display 506 of FIGS. 5A and 5B may be examples of first assembly 102, second assembly 104, hinge assembly 122, continuous display 106 of FIGS. 1A and 1B. Similarly, primary flexible segment 508 may be an example of primary flexible segment 108 of FIG. 1.

In accordance with one or more aspects of this disclosure, collapsible support platforms 582/584 and hinge assembly 522 may be configured such that, as device 500 is transitioned from the closed state to the open state, collapsible support platforms 582/584 articulate against edges 585/589 of hinge assembly 522 to cause collapsible support platforms 582/584 to deploy and support at least primary flexible segment 508 of continuous display 506. For instance, as device 500 is transitioned from the closed state to the open state, a lower surface of collapsible support platform 582 may come into contact with edge 585 of hinge assembly. As device 500 transitions closer to the open state, collapsible support platform 582 may articulate against (e.g., pivot on and/or slide on) edge 585 such that collapsible support platform 582 is pushed into a deployed state (e.g., where an upper surface of collapsible support platform 582 is provides support to (e.g., functions as a rigid backing for) continuous display 506. Similarly, as device 500 transitions closer to the open state, collapsible support platform 584 may articulate against (e.g., pivot on and/or slide on) edge 589 such that collapsible support platform 584 is pushed into a deployed state (e.g., where an upper surface of collapsible support platform 584 is provides support to (e.g., functions as a rigid backing for) continuous display 506.

As discussed above, electronic components of a folding device (e.g., battery(ies), processors, data storage, radio transceivers, etc.) may be distributed between various assemblies. As a result, it may be desirable to provide for electrical interconnection between first assembly 502 and second assembly 504. In accordance with one or more aspects of this disclosure, device 500 may include flexible printed circuit 578 configured to connect electric components of first assembly 502 with electric components of second assembly 504. Flexible printed circuit 578 may be routed so as to avoid being pinched or otherwise damaged during opening and closing of device 500. For instance, as shown in FIG. 5B, flexible printed circuit 578 may be routed between collapsible support platforms 582/584 and hinge assembly 522. Any combination of collapsible support platforms 582/584 and hinge assembly 522 may include relief cuts to accommodate flexible printed circuit 578. The path of flexible printed circuit 578 in the open position is denoted 5780. Similarly, the path of flexible printed circuit 578 in the closed position is denoted 578C.

In general, it may desirable for collapsible support platforms 582/584 to provide uniform support. Additionally, it may be desirable to minimize tolerance requirements of collapsible support platforms 582/584 and hinge assembly 522. Where collapsible support platforms 582/584 and hinge assembly 522 are all formed of metal, it may be necessary to maintain relatively tight tolerances in order to ensure uniform support. As noted above, such tight tolerances may be undesirable.

In accordance with one or more aspects of this disclosure, device 500 may include shims at bearing points between collapsible support platforms 582/584 and hinge assembly 522. For instance, shim 586 may be attached to collapsible support platform 582 (e.g., with adhesive). Shim 586 may be configured to bear against first edge 585 to articulate collapsible support platform 582. Similarly, shim 588 may be attached to collapsible support platform 584 (e.g., with adhesive) and may be configured to bear against second edge 589 to articulate collapsible support platform 584. Shims 586 and 588 may be formed of a non-metallic material, such as foam. By including shims 586 and 588, tolerances of one or more of collapsible support platforms 582/584 and hinge assembly 522 may be reduced.

Additionally or alternatively to shims between collapsible support platforms 582/584 and hinge assembly 522 (e.g., shims 586 and 588), device 500 may include shims at bearing points between collapsible support platforms 582/584 and first/second assemblies 502/504. For instance, shim 574 may be attached to first assembly 502 (e.g., with adhesive). Shim 574 may be configured to bear against collapsible support platform 582. Similarly, shim 576 may be attached to second assembly 504 (e.g., with adhesive) and may be configured to bear against collapsible support platform 584. Shims 574 and 576 may be formed of a non-metallic material, such as foam. By including shims 574 and 576, tolerances of one or more of collapsible support platforms 582/584 and first/second assemblies 502/504 may be reduced. Additionally or alternatively, inclusion of shims 574 and 576 may reduce noise (e.g., squeals) generated by opening/closing device 500.

Figure 6:
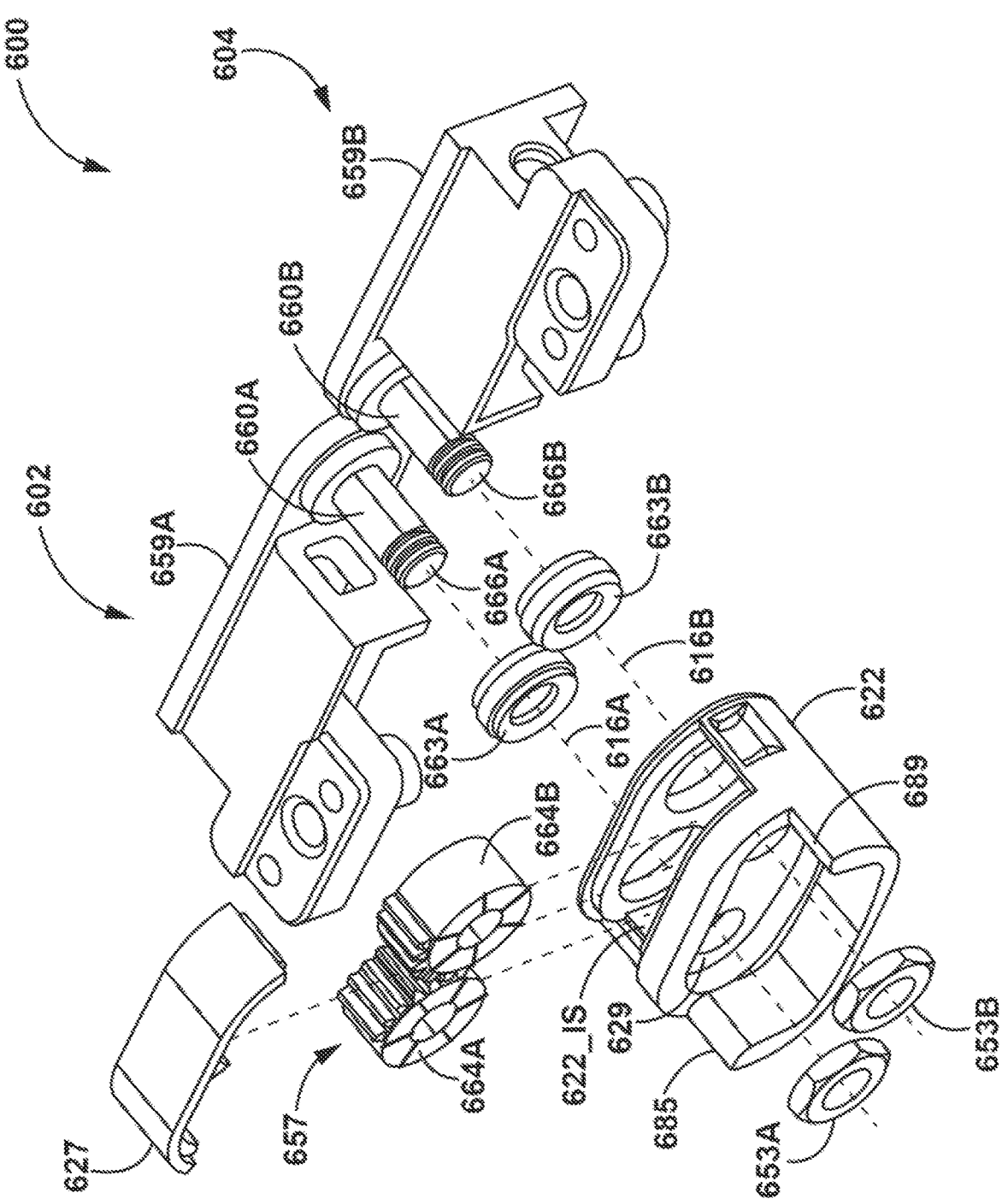
FIG. 6 is a schematic diagram illustrating an exploded view of components of a folding device with force members, in accordance with one or more aspects of this disclosure.

FIG. 6 is a schematic diagram illustrating an exploded view of components of a folding device with force members, in accordance with one or more aspects of this disclosure. As shown in FIG. 6, device 600 may include first assembly 602, second assembly 604, hinge assembly 622, synchronization components 657, force members 663A and 663B (collectively, "force members 663"), hinge arm assemblies 659A and 659B (collectively, "hinge arm assemblies 659"), and retaining members 653A and 653B (collectively, "retaining members "653"). Device 600 may be an example of device 100 of FIG. 1. First assembly 602, second assembly 604, and hinge assembly 622 may be examples of first assembly 502, second assembly 504, and hinge assembly 522 of FIGS. 5A and 5B.

As shown in FIG. 6, hinge arm assemblies 659 may each include a shaft centered on an axis. For instance, hinge arm assembly 659A may include shaft 660A centered on first axis 616A (which may be an example of axis 116A), and hinge arm assembly 659B may include shaft 660B centered on second axis 616B (which may be an example of axis 116B).

Figure 7A:
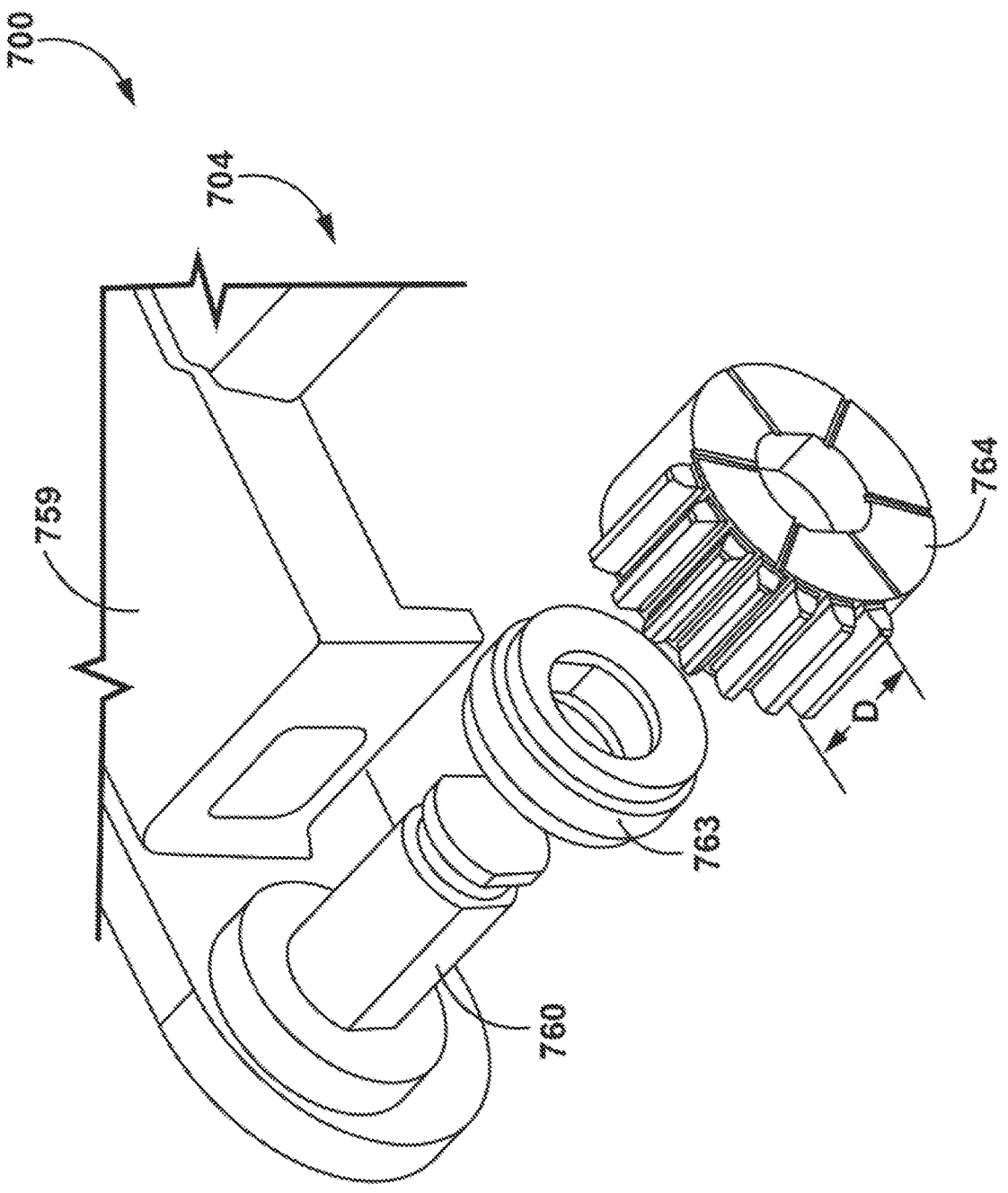
FIGS. 7A and 7B are schematic diagrams illustrating various perspectives of an exploded view of components of a folding device with force members, in accordance with one or more aspects of this disclosure.
Figure 7B:
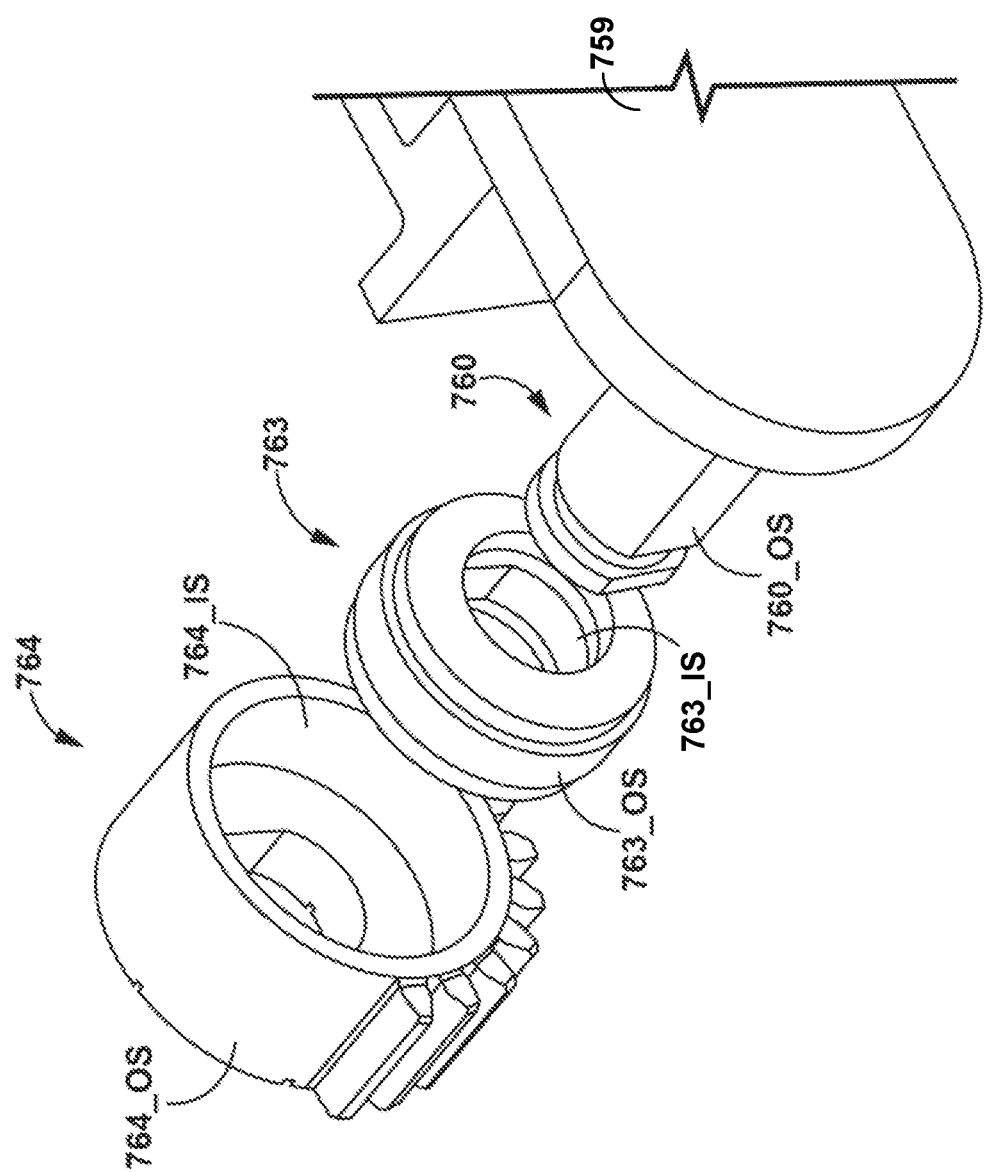

In some examples, shafts 660A and 660B (collectively, "shafts 660") may include a section configured to receive a retaining member, such as retaining members 653. A section of a shaft may be configured to receive a retaining member in a variety of way. As one example, as shown in FIG. 6, shafts 660 may each include a threaded section (e.g., threaded section 666A and 666B) to receive an oppositely threaded retaining member. As another example, shafts 660 may each include grooved section configured to receive a clip-type retaining member (e.g., as shown in FIGS. 7A and 7B).

An outer geometry of shafts 660 may be configured such that components may be placed on shafts 660 in a rotationally locked state with respect to shafts 660. For instance, as shown in FIG. 6, the outer surface of shafts 660 may be cammed.

Synchronization components 657 may be configured to synchronize rotation of first assembly 602 and second assembly 604. As such, similar to as shown in FIG. 2, first assembly 602 and second assembly 604 may maintain a similar angular deflection with respect to hinge assembly 622. For instance, if first assembly 602 is rotated 45 degrees about axis 616A, synchronization components 657 may cause second assembly 602 to rotate 45 degrees (albeit in an opposite direction) about axis 616B. As shown in FIG. 6, synchronization components 657 may include first gear 664A mounted on shaft 660A and second gear 664B mounted on shaft 660B. An inner geometry of gears 664A and 664B (collectively, "gears 664") may be configured to lock rotation to shafts 660. For instance, as shown in FIG. 6, an inner surface cross section of at least a portion of gears 664 may correspond to an outer surface cross section of at least a portion of shafts 660.

As noted above, device 600 may include retaining members 653, which may be configured to secure various components on shafts 660. For instance, retaining members 653 may secure gears 664 and force members 663 on shafts 660. As one example, where retaining members 653 include nuts (e.g., as shown in FIG. 6), retaining members 653 may be threaded onto threaded sections 666 of shafts 660.

As noted above, it may be desirable to increase an amount of force needed to rotate first assembly 602 and second assembly 604. In accordance with one or more aspects of this disclosure, device 600 may include force members 663 that are configured to increase an amount of force needed to rotate first assembly 602 and second assembly 604. For instance, force members 663 may provide a force that resists rotation of first assembly 602 and second assembly 604 about axes 616A/616B. In some examples, force members 663 may include disk springs. As force members 663 are compressed, force members 663 may produce axial force and push an outer surface of gears 664 against inner surface 622_IS of hinge assembly 622. As such, gears 664 may frictionally engage inner surface 622_IS of hinge assembly 622. The pressure of the frictional engagement between gears 664 and inner surface 622_IS may dictate the amount of force needed to rotate first assembly 602 and second assembly 604. In this way, force members 663 may provide device 600 with a more rigid feel. Also in this way, the force members may enable device 600 to hold intermediate positions between fully open and fully closed (e.g., a half open position where assemblies 602/604 are at approximately a 90 degree angle with respect to each other).

In one example, the components of FIG. 6 may be assembled as follows. Gears 664 may be placed into hinge assembly 622. Force members 663 may be inserted through an end of hinge assembly 622 to at least partially reside in cavities of gears 664 (see FIG. 7B). Shafts 660 may be inserted through force members 663 and gears 664 such that at least a portion of threaded sections 666 extends past bulkhead 629 of hinge assembly 622. Barrel cover 627 may be attached to hinge assembly 622 (e.g., via press fit, adhesive, or any other suitable technique). Retaining members 653 may be attached to shafts 690. In some examples, a torque with which retaining members 653 are threaded onto threaded sections 666 may be adjusted to change the amount of force needed to rotate first assembly 602 and second assembly 604. For instance, an increase in the torque of retaining members 653 may result in an increase in compression of force members 663, which may in turn increase the amount of force needed to rotate first assembly 602 and second assembly 604.

While the collapsible support platforms are not shown in FIG. 6, it is understood that such platforms may still articulate on edges 685 and 689 of hinge assembly 622. In other words, edges 685 and 689 may be examples of edges 585 and 589 of FIGS. 5A and 5B.

FIGS. 7A and 7B are schematic diagrams illustrating various perspectives of an exploded view of components of a folding device with force members, in accordance with one or more aspects of this disclosure. As shown in FIGS. 7A and 7B, device 700 may include assembly 704, hinge arm 759, force member 763, and gear 764. Device 700 may be an example of device 600 of FIG. 6. Assembly 704, hinge arm 759, force member 763, and gear 764 of FIGS. 7A and 7B may be examples of assembly 604, hinge arm 659, force member 663, and gear 664 of FIG. 6. While only a single side is illustrated in FIGS. 7A and 7B, it is understood that both sides of a folding device may include components similar to those shown in FIGS. 7A and 7B.

As noted above, when assembled, at least a portion of a force member may reside in a cavity defined by a gear. For instance, as shown in FIG. 7B, gear 764 may define a cavity in-which force member 763 may reside when gear 764 and force member 763 are assembled on shaft 760. As also shown in FIGS. 7A and 7B, when assembled, an outer surface of force member 763 (e.g., 763_OS) may engage an inner surface of gear 764 (e.g., 764_IS), an inner surface of force member 763 (e.g., 763_IS) may engage an outer surface of shaft 760 (e.g., 760_OS).

As shown in FIG. 3 and discussed above, some designs may include many components on shafts of hinge arms. However, as this disclosure enables the omission/elimination of several components (e.g., lever arms 354, lever knobs 355, and/or clamp stop 356) on the shafts and/or a removal of primary gears from hinge arms (e.g., in some examples, the hinge arms may not include gears that engage each other), a depth D of gear 764 may be increased. Such an increase may be desirable as increasing D may result in an increase in engagement area between gears, which may improve resilience and reliability.

The following numbered example may illustrate one or more aspects of this disclosure:

Example 1. A folding device comprising: a hinge assembly defining a first axis and a second axis; a first assembly comprising a first hinge arm that includes a first shaft rotatably connected to the hinge assembly about the first axis; a second assembly comprising a second hinge arm that includes a second shaft rotatably connected to the hinge assembly about the second axis; a first gear mounted on the first shaft; a second gear mounted on the second shaft, wherein the first gear is configured to mesh with the second gear to synchronize movement of the first assembly and the second assembly; a first force member mounted on the first shaft; a second force member mounted on the second shaft, wherein the first force member and the second force member are collectively configured to increase an amount of force needed to rotate the first assembly and the second assembly; and a continuous display spanning an inner surface of the first assembly and an inner surface of the second assembly.

Example 2. The folding device of example 1, wherein the first force member comprises a first disk spring, and wherein the second force member comprises a second disk spring.

Example 3. The folding device of example 2, wherein: an outer surface of the first disk spring engages an inner surface of the first gear; an inner surface of the first disk spring engages an outer surface of the first shaft; an outer surface of the second disk spring engages an inner surface of the second gear; and an inner surface of the second disk spring engages an outer surface of the second shaft.

Example 4. The folding device of example 1, wherein the folding device further comprises: a first retaining member configured to secure the first shaft to the hinge assembly; and a second retaining member configured to secure the second shaft to the hinge assembly.

Example 5. The folding device of example 4, wherein the first shaft comprises a first threaded section, wherein the second shaft comprises a second threaded section, wherein the first retaining member comprises a first nut configured to screw onto the first threaded section; and wherein the second retaining member comprises a second nut configured to screw onto the second threaded section.

Example 6. The folding device of example 1, wherein the first gear and the second gear are configured to frictionally engage an inner surface of the hinge assembly.

Example 7. The folding device of example 1, wherein, when the folding device is fully opened about the hinge assembly, an inner surface of the first assembly is coplanar with an inner surface of the second assembly, the folding device further comprising: a first collapsible support platform attached to the first assembly and configured to articulate against a first edge of the hinge assembly to support the primary flexible segment when the folding device is fully opened; and a second collapsible support platform attached to the second assembly and configured to articulate against a second edge of the hinge assembly to support at least the primary flexible segment when the folding device is fully opened.

Example 8. The folding device of example 7, wherein, when the folding device is fully opened, the first collapsible support platform is in contact with at least half of a length of the first edge and the second collapsible support platform is in contact with at least half of a length of the second edge.

Example 9. The folding device of example 1, wherein the display continuous comprises an organic light-emitting diode (OLED) display or a micro light emitting diode display.

Various aspects have been described in this disclosure. These and other aspects are within the scope of the following claims.

The invention claimed is:

1. A folding device comprising:
a hinge assembly defining a first axis and a second axis;
a first assembly comprising a first hinge arm that includes a first shaft rotatably connected to the hinge assembly about the first axis;

a second assembly comprising a second hinge arm that includes a second shaft rotatably connected to the hinge assembly about the second axis;
a first gear mounted on the first shaft;
a second gear mounted on the second shaft, wherein the first gear is configured to mesh with the second gear to synchronize movement of the first assembly and the second assembly;
a first disk spring mounted on the first shaft;
a second disk spring mounted on the second shaft, wherein the first disk spring and the second disk spring are collectively configured to increase an amount of force needed to rotate the first assembly and the second assembly, wherein:
an outer surface of the first disk spring engages an inner surface of the first gear;
an inner surface of the first disk spring engages an outer surface of the first shaft;
an outer surface of the second disk spring engages an inner surface of the second gear; and
an inner surface of the second disk spring engages an outer surface of the second shaft; and
a continuous display spanning an inner surface of the first assembly and an inner surface of the second assembly.

2. The folding device of claim 1, wherein the folding device further comprises:
a first retaining member configured to secure the first shaft to the hinge assembly; and
a second retaining member configured to secure the second shaft to the hinge assembly.

3. The folding device of claim 2, wherein the first shaft comprises a first threaded section, wherein the second shaft comprises a second threaded section, wherein the first retaining member comprises a first nut configured to screw onto the first threaded section; and wherein the second retaining member comprises a second nut configured to screw onto the second threaded section.

4. The folding device of claim 1, wherein the first gear and the second gear are configured to frictionally engage an inner surface of the hinge assembly.

5. The folding device of claim 1, wherein, when the folding device is fully opened about the hinge assembly, an inner surface of the first assembly is coplanar with an inner surface of the second assembly, the folding device further comprising:
a first collapsible support platform attached to the first assembly and configured to articulate against a first edge of the hinge assembly to support the primary flexible segment when the folding device is fully opened; and
a second collapsible support platform attached to the second assembly and configured to articulate against a second edge of the hinge assembly to support at least the primary flexible segment when the folding device is fully opened.

6. The folding device of claim 5, wherein, when the folding device is fully opened, the first collapsible support platform is in contact with at least half of a length of the first edge and the second collapsible support platform is in contact with at least half of a length of the second edge.

7. The folding device of claim 1, wherein the display continuous comprises an organic light-emitting diode (OLED) display or a micro light emitting diode display.

* * * * *